United States Patent
Fukayama et al.

(10) Patent No.: US 10,607,964 B2
(45) Date of Patent: Mar. 31, 2020

(54) SEMICONDUCTOR DEVICE

(71) Applicant: TOSHIBA MEMORY CORPORATION, Tokyo (JP)

(72) Inventors: Shinya Fukayama, Nagoya Aichi (JP); Yukifumi Oyama, Yokkaichi Mie (JP); Keisuke Taniguchi, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 527 days.

(21) Appl. No.: 15/061,989

(22) Filed: Mar. 4, 2016

(65) Prior Publication Data

US 2016/0351541 A1    Dec. 1, 2016

(30) Foreign Application Priority Data

May 29, 2015   (JP) .................. 2015-110524

(51) Int. Cl.
*H01L 29/49*   (2006.01)
*H01L 25/065*   (2006.01)
*H01L 23/00*   (2006.01)

(52) U.S. Cl.
CPC .......... *H01L 25/0657* (2013.01); *H01L 24/14* (2013.01); *H01L 24/13* (2013.01); *H01L 24/16* (2013.01); *H01L 24/75* (2013.01); *H01L 24/81* (2013.01); *H01L 2224/0401* (2013.01); *H01L 2224/0557* (2013.01);
(Continued)

(58) Field of Classification Search
CPC ..... H01L 25/0657; H01L 24/14; H01L 24/13; H01L 24/16; H01L 24/75; H01L 24/81
See application file for complete search history.

(56) References Cited

U.S. PATENT DOCUMENTS 8,169,075 B2   5/2012   Takahashi et al.
8,710,654 B2   4/2014   Tsukiyama et al.
(Continued)

FOREIGN PATENT DOCUMENTS

JP   H04-137041 U1   12/1992
JP   2000-012616 A    1/2000
(Continued)

OTHER PUBLICATIONS

Taiwanese Office Action dated Jun. 20, 2017, filed in Taiwanese counterpart Patent Application No. 104137395 (5 pages) with English translation.
(Continued)

*Primary Examiner* — Jose R Diaz
(74) *Attorney, Agent, or Firm* — Kim & Stewart LLP

(57) ABSTRACT

A semiconductor device includes a semiconductor chip in which a first bump is provided on a first surface, a plurality of first adhesives are provided on the first surface of the semiconductor chip, and a second adhesive is provided on the first surface of the semiconductor chip, and of which a layout area on the first surface is smaller than a layout area of the plurality of first adhesives. In comparison to a first adhesive that is farthest from the center or a moment of inertia of the first surface of the semiconductor chip among the plurality of the first adhesives, the second adhesive is provided farther from the center or the moment of inertia of the semiconductor chip.

20 Claims, 7 Drawing Sheets

(52) U.S. Cl.
CPC .............. *H01L 2224/131* (2013.01); *H01L 2224/13014* (2013.01); *H01L 2224/1319* (2013.01); *H01L 2224/13025* (2013.01); *H01L 2224/1403* (2013.01); *H01L 2224/14131* (2013.01); *H01L 2224/14135* (2013.01); *H01L 2224/14152* (2013.01); *H01L 2224/14177* (2013.01); *H01L 2224/14181* (2013.01); *H01L 2224/14505* (2013.01); *H01L 2224/14517* (2013.01); *H01L 2224/16146* (2013.01); *H01L 2224/16238* (2013.01); *H01L 2224/75315* (2013.01); *H01L 2225/06513* (2013.01); *H01L 2225/06517* (2013.01); *H01L 2225/06541* (2013.01); *H01L 2924/1438* (2013.01); *H01L 2924/14511* (2013.01); *H01L 2924/3511* (2013.01)

(56) References Cited

U.S. PATENT DOCUMENTS

| | | | |
|---|---|---|---|
| 9,018,969 | B2 | 4/2015 | Ishikawa et al. |
| 9,099,459 | B2 | 8/2015 | Sato et al. |
| 9,570,414 | B2 | 2/2017 | Tsukiyama et al. |
| 2009/0039529 | A1* | 2/2009 | Mueller ............ H01L 23/13 257/778 |
| 2013/0134583 | A1* | 5/2013 | Tsukiyama ...... H01L 23/49811 257/737 |
| 2015/0069596 | A1 | 3/2015 | Kawasaki et al. |
| 2015/0069634 | A1 | 3/2015 | Oyama et al. |
| 2015/0130072 | A1 | 5/2015 | Wu et al. |
| 2015/0287687 | A1* | 10/2015 | Farrens ............ H01L 24/11 257/737 |
| 2016/0351541 | A1 | 12/2016 | Fukayama et al. |

FOREIGN PATENT DOCUMENTS

| | | |
|---|---|---|
| JP | 2009-260247 A | 11/2009 |
| JP | 2013-008963 A | 1/2013 |
| JP | 2013083619 A | 5/2013 |
| JP | 2014072487 A | 4/2014 |
| JP | 2014-183278 A | 9/2014 |
| JP | 2015-053406 A | 3/2015 |
| JP | 2015041743 A | 3/2015 |
| JP | 2015056563 A | 3/2015 |
| JP | 2015090937 A | 5/2015 |
| TW | 2014-38185 | 10/2014 |
| TW | 2015-11214 | 3/2015 |

OTHER PUBLICATIONS

Japanese Office Action dated Mar. 23, 2018 filed in counterpart Japanese Patent Application No. 2015-110524 (11 pages) (with translation).

Chinese First Office Action dated Apr. 2, 2018, filed in counterpart Chinese Patent Application No. 201510850009.6 (8 pages) (with English Translation).

Japanese Office Action dated May 21, 2018, filed in Japanese counterpart Application No. 2015-110524, 8 pages (with translation).

* cited by examiner

SEMICONDUCTOR DEVICE

CROSS-REFERENCE TO RELATED APPLICATION

This application is based upon and claims the benefit of priority from Japanese Patent Application No. 2015-110524, filed May 29, 2015, the entire contents of which are incorporated herein by reference.

FIELD

Embodiments described herein relate generally to a semiconductor device.

BACKGROUND

When stacking a plurality of semiconductor chips in one package for miniaturization and/or high functionality of a resulting semiconductor device, such as a NAND type electrically erasable programmable read-only memory (EEPROM), a through silicon via (TSV) may be used to transmit and receive an electrical signal at a high speed between the plurality of semiconductor chips. The TSV electrically connects electrodes, which are provided on a front surface and a rear surface of each of the semiconductor chips, through a conductive via that passes through the substrate of the semiconductor chip.

When stacking the semiconductor chips and interconnecting electrodes between the semiconductor chips, the semiconductor chips are also bonded together with an adhesive. However, the semiconductor chips are thinned for reducing the thickness of the resulting semiconductor device, and thus, warping of the individual semiconductor chips may occur. The warping of the semiconductor chips widens a gap between the adjacent semiconductor chips in the stack of semiconductor chips, for example, at corners of adjacent semiconductor chips in the stack. If the semiconductor chips are flattened during assembly into the stacked device, where the stress in any of the semiconductor chips is greater than an adhesive strength of the adhesive holding adjacent semiconductor chips together, the semiconductor chip may peel away from the adhesive at the corner of the semiconductor chip.

DETAILED DESCRIPTION

Example embodiments described herein provide a semiconductor device capable of suppressing peeling away or peeling-off of an adhesive between a plurality of stacked semiconductor chips, or suppressing peeling of the semiconductor chip from the adhesive.

According to an embodiment, a semiconductor device includes a semiconductor chip having a first bump on a first surface; a plurality of first adhesive portions provided on a first layout area of the first surface of the semiconductor chip; and a second adhesive portion provided on a second layout area of the first surface of the semiconductor chip, smaller than the first layout area, wherein the second adhesive portion is located farther from a center of the semiconductor chip when compared to a first one of the first adhesive portions of the plurality of first adhesive portions that is furthest from the center of the semiconductor chip.

Hereinafter, exemplary embodiments will be described with reference to the attaching drawings. The invention is not limited by the embodiments. In the following embodiments, an upper and lower direction of a first substrate and a second substrate represents a relative direction in a case where a surface on which a semiconductor chip is provided is set as an upper side, and may be different from an upper and lower direction in accordance with up and down in terms of gravitational acceleration.

First Embodiment

Figure 1:
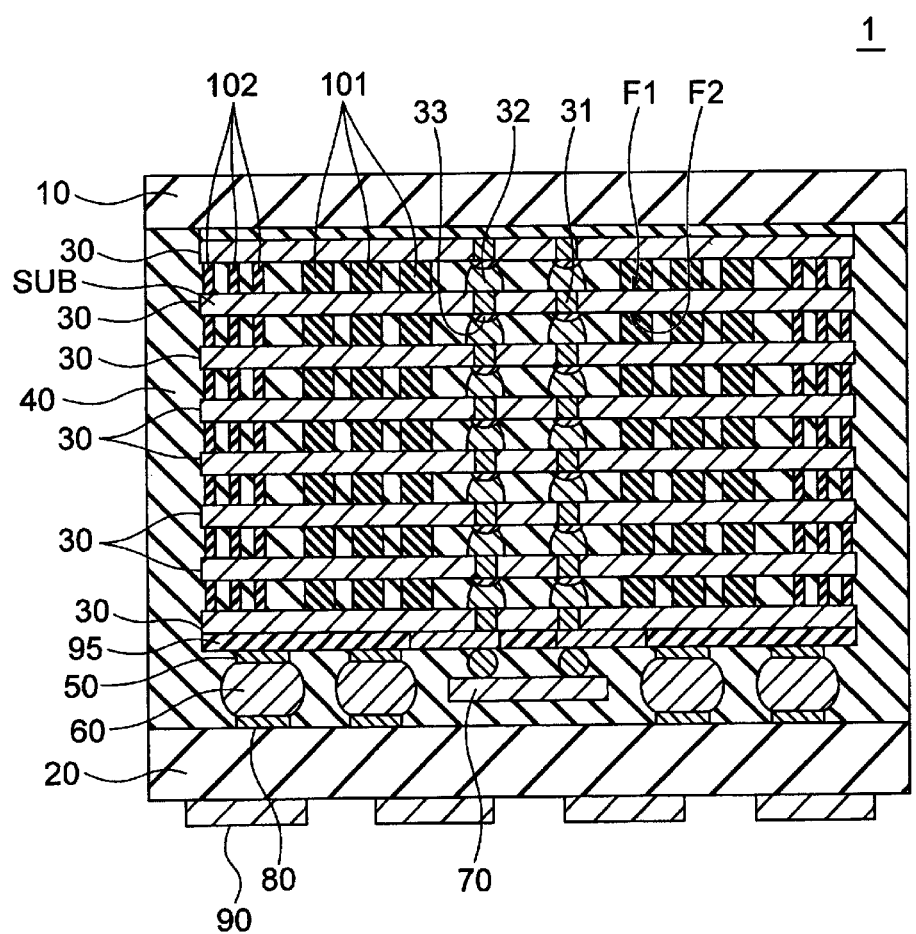
FIG. 1 is a cross-sectional view illustrating an example of a configuration of a semiconductor device according to a first embodiment.

FIG. 1 is a cross-sectional view illustrating an example of a configuration of a semiconductor device 1 according to a first embodiment. For example, the semiconductor device 1 includes a semiconductor memory chip such as a plurality of stacked NAND type EEPROMs.

The semiconductor device 1 includes a first substrate 10 and a second substrate 20, a plurality of semiconductor chips 30 therebetween, a sealing resin 40, an electrode pad 50, a solder ball 60, an interface (IF) chip 70, an internal connection terminal 80, an external connection terminal 90, a wiring layer 95, a first adhesive 101, and a second adhesive 102.

The plurality of the semiconductor chips 30 are stacked between the first substrate 10 and the second substrate 20. For example, a highly heat conductive material such as a metal is used for the first substrate 10. For example, an insulating material such as a resin is used for the second substrate 20. For example, the semiconductor chip 30 is a memory chip in which a NAND type EEPROM is mounted.

The semiconductor chip 30 includes a semiconductor substrate SUB, a through-via 31, a first bump (micro bump) 32, and an electrode 33. For example, the semiconductor substrate SUB is a silicon substrate. The through-via (TSV) 31 extends through the semiconductor substrate SUB from a first surface F1 to a second surface F2 thereof, and electrically connects the electrode 33 and the first bump 32. The second surface F2 of the semiconductor substrate SUB is opposed to the first surface F1 of the semiconductor substrate SUB. The first bump 32 is electrically connected to the through-via 31 on a first surface F1 side of the semiconductor substrate SUB. The electrode 33 is electrically connected to the through-via 31 on a second surface F2 side of the semiconductor substrate SUB. A metal layer such as a barrier metal is provided between the through-via 31 and the first bump 32. A multi-layer wiring layer including a metal layer and an insulating layer is provided between the through-via 31 and the electrode 33. A semiconductor element, which is electrically connected to the through-via 31 and the electrode 33, is provided as necessary. For example, a conductive material such as a metal is used for the through-via 31, the first bump 32, and the electrode 33.

The first adhesive 101 and the second adhesive 102 are provided between each of the plurality of stacked semiconductor chips 30, and bonds the adjacent semiconductor chips 30 to each other. In the first and second adhesives 101 and 102, for example, a viscous insulating (dielectric) material such as polyimide is used. Details of the first and second adhesives 101 and 102 will be described later.

The IF chip (interface chip) 70 is provided between the second substrate 20 and the semiconductor chip 30 that is closest to the second substrate 20. The IF chip 70 is flip-chip connected (FC connected) for data communication between the plurality of stacked semiconductor chips 30, and an external device (not illustrated).

The wiring layer 95 includes a wiring (rewiring) in an insulating film, and electrically connects an electrode of the semiconductor chip 30 or the IF chip 70 to the internal connection terminal 80 through the electrode pad 50 and the solder ball 60.

The internal connection terminal 80 is electrically connected to the external connection terminal 90 through a wiring (not illustrated) that is provided within the second substrate 20. In a case where the semiconductor device 1 is a land grid array (LGA) package, the external connection terminal 90 is provided as a metal land. When the semiconductor device 1 is a ball grid array (BGA) package, the external connection terminal 90 is provided as a protrusion terminal including a solder ball, solder plating, gold (Au) plating, and the like. The external connection terminal 90 may be electrically connected to an external device. For example, a conductive metal is used for the electrode pad 50, the internal connection terminal 80, and the external connection terminal 90.

A space between the stacked semiconductor chips 10, a space between the semiconductor chip 30 and the first substrate 10, and a space between the semiconductor chip 30 and the second substrate 20, are filled with the sealing resin (underfill material) 40. Thus, the sealing resin 40 protects the semiconductor chips 30 in the semiconductor package.

Figure 2:
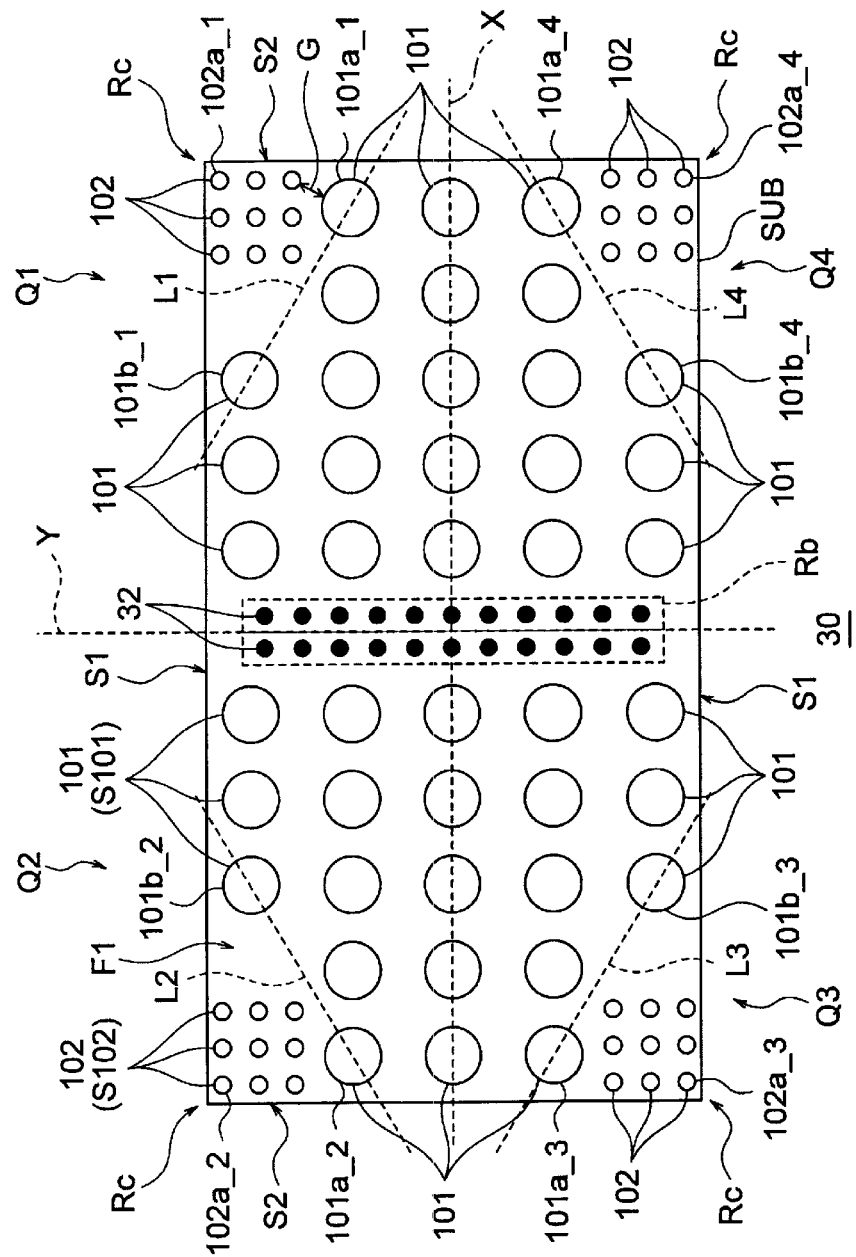
FIG. 2 is a plan view illustrating an example of a configuration of a semiconductor chip.

FIG. 2 is a plan view illustrating an example of a configuration of one of the semiconductor chips 30 of FIG. 1. In FIG. 2, the first surface F1 of the semiconductor chip 30 is illustrated. In this embodiment, the first surface F1 of the semiconductor chip 30 has a geometric shape such as a substantially quadrangular (rectangular) shape, and has a long side S1 and a short side S2. As described above, the first bumps 32, the first adhesives 101, and the second adhesives 102 are provided on the first surface F1. Further, the geometric shape of the first surface F1 may be a substantially polygonal shape without limitation to the substantially quadrangular shape shown.

The first bumps 32 are provided in a bump region Rb indicated by a dashed line. For example, the first bumps 32 are arranged in rows which are substantially parallel with the short side S2 in the central portion of the long side S1 of the semiconductor chip 30. For example, a memory cell array (not illustrated) is provided on both sides of the bump region Rb, and the first bumps 32 in the bump region Rb may function as an I/O terminal, a power supply terminal, or a ground terminal during data communication with the memory cell array.

A plurality of the first adhesives 101 are provided at the periphery of the bump region Rb. In this embodiment, each of the first adhesives 101 are arranged on the first surface F1 to have a substantially circular shape in plan view (e.g., top-down) on the first surface F1, respectively. An area (first surface area) of each of the first adhesives 101 on the first surface F1 is shown as S101. As described above, for example, a viscous insulating material such as polyimide is used as the first adhesive 101.

A plurality of the second adhesives 102 are provided at the four corner regions Rc of the first surface F1 of the semiconductor chip 30. The corner regions Rc are located at geometric corners of the first surface F1. For example, in a case where the geometric shape of the first surface F1 is substantially quadrangular shape, the corner regions Rc are the four corner regions of the quadrangle. In this embodiment, the second adhesives 102 on the first surface F1 have a substantially circular shape in plan view on the first surface F1, respectively. An area (second surface area) of each of the second adhesives 102 on the first surface F1 is shown as S102. As described above, for example, a viscous insulating material such as polyimide is used for the second adhesives 102. Hereinafter, areas S101 and S102 are referred to as layout areas of the first adhesive 101 and the second adhesive 102, respectively. Further, in FIG. 2, the number of the second adhesives 102 which are provided in each corner region Rc is nine, but the number of the second adhesives 102 is not limited as such. However, when considering the strength of the second adhesives 102, the number of the second adhesives 102 is preferably 3 or greater.

According to this embodiment, the layout area S102 of the second adhesive 102 is less than the layout area S102 of the first adhesive 101. In addition, the second adhesive 102 is arranged in the corner region Rc of the semiconductor chip 30, and thus the second adhesive 102 is farther spaced away from the bump region Rb in comparison to the first adhesive 101. That is, the second adhesive 102 is provided farther from the geometric center (the moment of inertia when assuming that the density of the semiconductor chip 30 is constant) of the first surface F1 in comparison to the first adhesive 101. In contrast, the first adhesive 101 is arranged to be closer to the geometric center of the first surface F1 in comparison to the second adhesive 102.

For example, as illustrated in FIG. 2, an axis which is parallel with the long side S1 and passes through the geometric center of the semiconductor chip 30 is shown as an X-axis, and an axis which is parallel with the short side S2 and passes through the geometric center of the semiconductor chip 30 is shown as a Y-axis. Four quadrants of the first surface F1, which are partitioned by the X-axis and the Y-axis, are set as first to fourth quadrants Q1 to Q4, respectively. In this case, in the first quadrant Q1, a second adhesive 102a_1 (first adhesive portion) is farther from the geometric center of the first surface F1 in comparison to an arbitrary first adhesive 101 in the first quadrant Q1. In order words, the second adhesive 102a_1 is provided at a position farther from the geometric center in comparison to a first adhesive 101a_1 or 101b_1 which are farthest from the geometric center of the first surface F1 among the first adhesives 101. This spatial relationship in the first quadrant Q1 is also reproduced in the second to fourth quadrants Q2 to Q4. That is, the second adhesives 102a_2, 102a_3 and 102a_4 (second, third and fourth adhesive portions) are provided at positions farther from the geometric center of the first surface F1 in comparison to first adhesives 101a_2 to 101a_4 or 101b_2 to 101b_4 which are farthest from the geometric center of the first surface F1 among the first adhesives 101.

In addition, in the first quadrant Q1, a straight line (first straight line) L1 connects the first adhesive 101a_1 (first adhesive portion) that is positioned on a short-side S2 side of the first surface F1 and is farthest from the geometric center of the first surface F1, and the first adhesive 101b_1 (second adhesive portion) that is positioned on a long-side S1 side of the first surface F1 and is farthest from the geometric center of the first surface F1. In the second quadrant Q2, a straight line (second straight line) L2 connects the first adhesive 101a_2 (third adhesive portion) that is positioned on a short-side S2 side of the first surface F1 and is farthest from the geometric center of the first surface F1, and the first adhesive 101b_2 (fourth adhesive portion) that is positioned on a long-side S1 side of the first surface F1 and is farthest from the geometric center of the first surface F1. In the third quadrant Q3, a straight line (third straight line) L3 connects the first adhesive 101a_3 (fifth adhesive portion) that is positioned on a short-side S2 side of the first surface F1 and is farthest from the geometric center of the first surface F1, and the first adhesive 101b_3 (sixth adhesive portion) that is positioned on a long-side S1 side of the first surface F1 and is farthest from the geometric center of the first surface F1. In the fourth quadrant Q4, a straight line (fourth straight line) L4 connects the first adhesive 101a_4 (seventh adhesive portion) that is positioned on a short-side S2 side of the first surface F1 and is farthest from the geometric center of the first surface F1, and the first adhesive 101b_4 (eighth adhesive portion) that is positioned on a long-side S1 side of the first surface F1 and is farthest from the geometric center of the first surface F1. In this case, the second adhesive 102 is provided in four regions (first regions) on the first surface F1 which are surrounded by the straight lines L1 to L4, the short side S2, and the long side S1. These four first regions may be referred to as the above-described corner regions Rc.

As described above, in this embodiment, the second adhesive 102a_1 having a layout area smaller than that of the first adhesive 101 is provided in the corner region Rc, and is arranged farther from the geometric center of the first surface F1 in comparison to the plurality of first adhesives 101. The reason why the second adhesive 102 is provided in this manner will be described below.

As described above, the semiconductor chip 30 is thinned to reduce the thickness of the semiconductor device 1, and warping of the chip 30 may occur. For example, the semiconductor chip 30 may have an internal stress tending to warp the semiconductor chip such that an undesirable gap occurs between the semiconductor chips 30 in each of the corner regions Rc of the semiconductor chip 30. When the semiconductor chips 30 are peeled away from the adhesive due to the stresses, the gap between the semiconductor chips 30 in the corner region Rc increases. In a case where the plurality of stacked semiconductor chips 30 are bent in the same manner, a deviation in the gap between the semiconductor chips 30 is integrated and/or multiplied over the height of the resulting device. Accordingly, in this case, in the corner region Rc, the semiconductor chips 30 after being stacked become significantly thicker than the central portion thereof. In addition, there is a concern that deviations in the gap(s) between the semiconductor chips 30 may cause a connection failure between bumps, and the like, and thus the manufacturing yield of the semiconductor device 1 deteriorates.

For example, a material such as polyimide, which has a certain elasticity, is used for the first adhesive 101 and the second adhesive 102. However, the first adhesive 101 is provided having a layout area that is greater than that of the second adhesive 102, and thus has rigidity that is higher than that of the second adhesives 102 in the corner regions Rc. Accordingly, the plurality of first adhesives 101 forma region which is less elastic than the corner region Rc of the second adhesives 102, and thus the first adhesive 101 is less likely to be stretched or contracted. On the other hand, the second adhesives 102 have a relatively small layout area, and thus the corner region Rc has a rigidity that is lower than that of the region of the first adhesives 101. However, the region Rc of the second adhesives 102 is more elastic than the region having the first adhesives 101, and thus is likely to be stretched or contracted. In addition, the first adhesives 101 are formed from the same material as that of the second adhesive 102, an adhesive force per unit area of the first adhesive 101 is substantially the same as that of the second adhesive 102. Accordingly, when the first adhesive 101 is provided over the entirety of the first surface F1 of each of the semiconductor chips 30, and the second adhesive 102 is not provided, the first adhesive 101 with high rigidity is not stretched or contracted as much. Accordingly, a relatively large stress is applied to an end of the first adhesive 101 in the corner region Rc, and thus the first adhesive 101 is likely to be peeled off from the semiconductor chips 30. When the semiconductor chips 30 are peeled off from the adhesive in the corner region Rc, it is difficult to control warpage of the corner region Rc of the semiconductor chips 30, and thus a deviation occurs in a gap between the stacked semiconductor chips 30.

Figure 3:
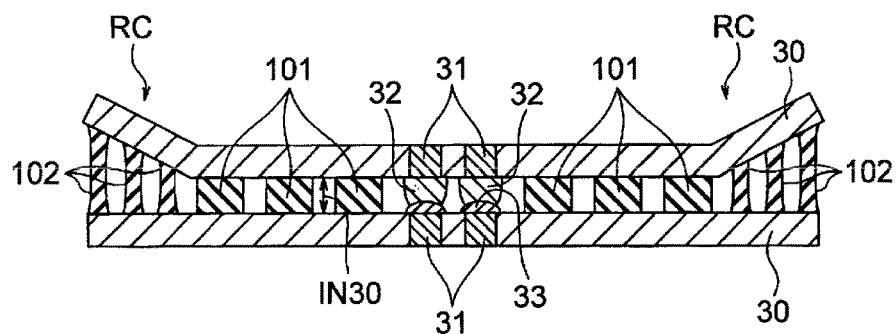
FIG. 3 is a cross-sectional view illustrating a bonding state of two semiconductor chips which are stacked.

On the other hand, in a case where the second adhesive 102 is provided in the corner region Rc, as illustrated in FIG. 3, the second adhesives 102 with high elasticity may be stretched or contracted to an extent greater than the first adhesives 101. Accordingly, the second adhesive 102 may be stretched between the semiconductor chips 30 without being peeled off from the semiconductor chips 30. FIG. 3 is a cross-sectional view illustrating a bonding state of two stacked semiconductor chips 30. The second adhesive 102 tends to be contracted, and thus applies a stress to the semiconductor chips 30, which operates in a direction opposite that of the stress due to the warpage in the semiconductor chips 30. Thus, in the corner region Rc, the second adhesive 102 is not peeled off from the semiconductor chips 30, and is capable of suppressing the deviation in the gap between the semiconductor chips 30 between the central portion and the corner region Rc of the semiconductor chips 30.

In addition, in a case where the second adhesive 102 is provided over the entirety of the first surface F1 of the semiconductor chip 30, and the first adhesive 101 is not provided, the second adhesive 102 with low rigidity is likely to be stretched and contracted between the semiconductor chips 30. Accordingly, the gap (IN30 in FIG. 3) between the semiconductor chips 30 becomes unstable. For example, when the first substrate 10 and the second substrate 20 are heated under pressure in the following stacking process, the gap IN30 between the semiconductor chips 30 becomes unstable. Accordingly, it is preferable to provide the first adhesive 101 with relatively high rigidity in the vicinity of the center (in the vicinity of the bump region Rb) of the first surface F1 of the semiconductor chips 30. Thus, it is possible to stabilize the gap IN30 between the semiconductor chips 30 to a predetermined gap even during the stacking process.

As described above, when the first adhesive 101 with a large layout area is arranged in the vicinity of the geometric center of the first surface F1, and the second adhesive 102 with a relatively smaller layout area is arranged in the corner region Rc of the first surface F1, it is possible to suppress peeling-off of the semiconductor chip 30 in the corner region Rc while stabilizing the gap IN30 between the semiconductor chip 30. As a result, it is possible to suppress the deviation in the gap(s) between the plurality of stacked semiconductor chips 30.

A minimum lateral gap G (closest spacing) between the first adhesive 101 and the second adhesive 102 on the first surface F1, as illustrated in FIG. 2, is determined in accordance with the size and shape (in plan view) of the first adhesive 101 having a relatively large layout area. For example, it is assumed that the individual first adhesives 101 have a circular shape having a diameter $\phi$ on the first surface F1, and the individual second adhesives 102 have a circular planar shape having a diameter $\phi 2$ (where $\phi 2 < \phi 1$). In this case, the minimum lateral gap G is determined in accordance with the diameter $\phi 1$. For example, the minimum lateral gap G is set to be equal to or greater than the diameter $\phi 1$. Thus, it is possible to prevent the first adhesive 101 from coming into contact with the second adhesive 102. If the minimum lateral gap G were set to be less than the diameter $\phi 1$, or the minimum lateral gap G was determined in accordance with the diameter $\phi 2$ of the second adhesive 102 with a relatively small layout area, the second adhesive 102 would be s too close to the first adhesive 101, and the second adhesive 102 could come into contact with the first adhesive 101.

Further, in this embodiment, the first bump 32, and the first and second adhesives 101 and 102 are arranged to be symmetrical to the X-axis and the Y-axis. However, it is not necessary for the arrangement of the first bump 32 and the first and second adhesives 101 and 102 to be symmetrical to the X-axis and the Y-axis.

In addition, in this embodiment, the geometric shape of the first surface F1 is a substantially quadrangular shape, but may be a polygonal shape other than the quadrangular shape. In addition, a portion of the geometric shape of the first surface F1 may have a rounded shape. Even in this case, the first adhesive 101 may be arranged in the vicinity of the center of the first surface F1, and the second adhesive 102 may be arranged in the corner region Rc (or the peripheral region) of the first surface F1.

In addition, in this embodiment, the shape of the first adhesives 101 and the second adhesives 102 in plan view is a circular shape. However, the shape of the first adhesive 101 and the second adhesive 102 may be a polygonal shape without limitation thereto.

Figure 4:
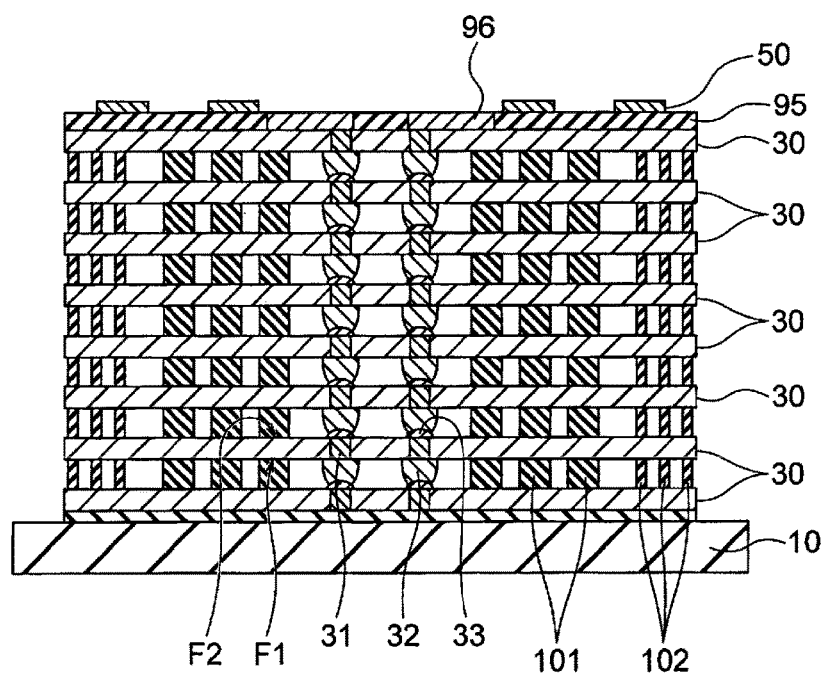
FIG. 4 is a cross-sectional view illustrating an example of a method of manufacturing the semiconductor device according to the first embodiment.
Figure 5:
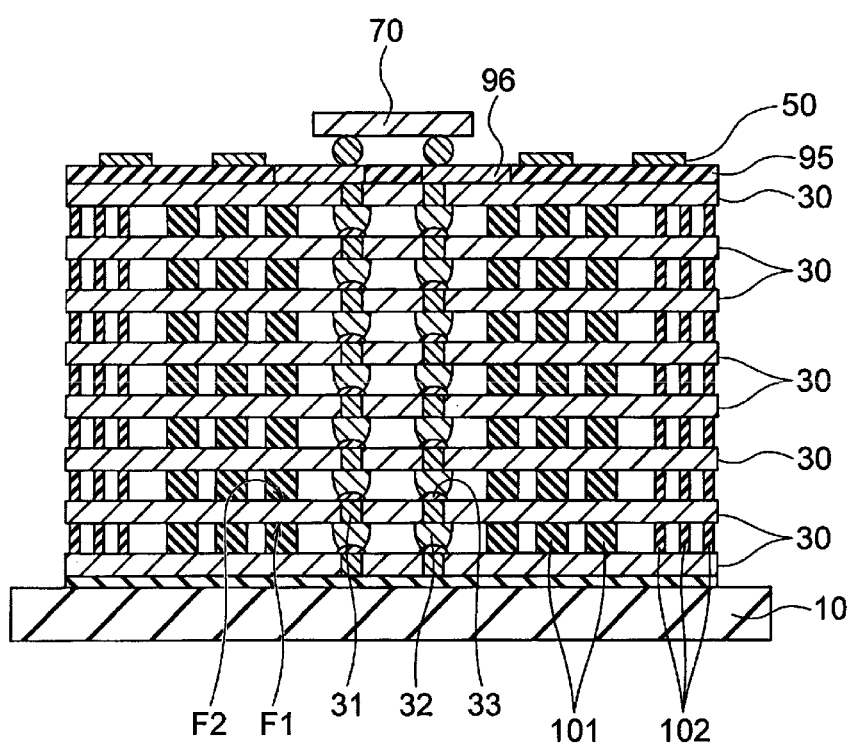
FIG. 5 is a cross-sectional view illustrating the method of manufacturing the semiconductor device which is continued from FIG. 4.
Figure 6:
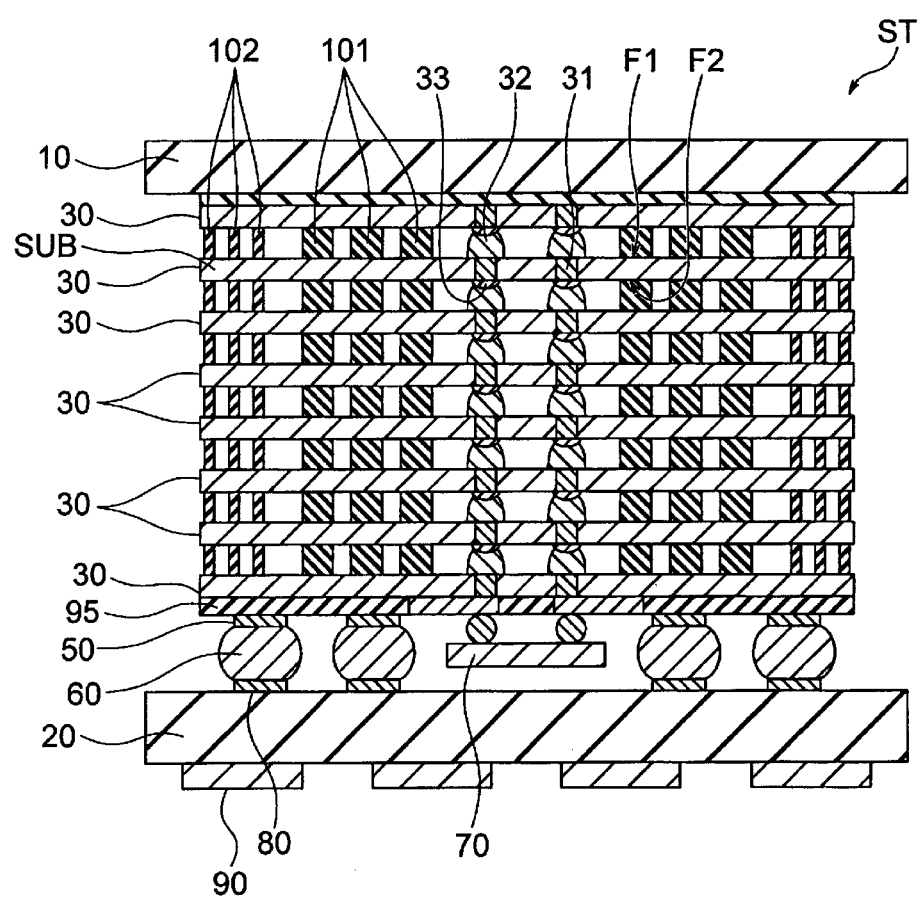
FIG. 6 is a cross-sectional view illustrating the method of manufacturing the semiconductor device which is continued from FIG. 5.

FIGS. 4 to 6 are cross-sectional views illustrating an example of a method of manufacturing the semiconductor device 1 according to the first embodiment. First, an initial semiconductor chip 30 is bonded onto the first substrate 10 with an adhesive (not illustrated). For example, the first substrate 10 may be a metal sheet. Then, a plurality of additional semiconductor chips 30 is sequentially stacked on the initial semiconductor chip 30. Thus, as illustrated in FIG. 4, the plurality of semiconductor chips 30 is stacked on the first substrate 10. At this time, the first bump 32 of one of the semiconductor chips 30 is electrically connected to the electrode 33 and the through-via 31 of a semiconductor chip 30 that is located below the one semiconductor chip 30.

As described above with reference to FIG. 2, the first bump 32 is provided in the bump region Rb on the first surface F1 of each of the semiconductor chips 30, and first and second adhesives 101 and 102 are provided in a region on the first surface F1 other than the bump region Rb. Accordingly, when the plurality of semiconductor chips 30 are stacked, the first and second adhesives 101 and 102 are arranged at a predetermined position between the semiconductor chips 30, thereby bonding the semiconductor chips 30 to each other (a stacking process). Further, for example, the first and second adhesives 101 and 102 may be formed on the first surface F1 by using a photosensitive polyimide, and the like, in accordance with lithography technology and etching technology.

Further, the wiring layer 95 is provided on a semiconductor chip 30, which is located on the uppermost end, prior to the stacking. Thus, a structure illustrated in FIG. 4 is obtained. The wiring layer 95 includes a wiring (rewiring) 96 in an insulating film, and includes the electrode pad 50 on the insulating film.

Next, as illustrated in FIG. 5, the IF chip 70 is mounted on the wiring 96. The IF chip 70 is electrically connected to the wiring 96 through a solder bump.

Next, the first bump 32, and the bump that electrically connects the IF chip 70 and the wiring 96 are melted in a reducing atmosphere, such as a formic acid atmosphere, and then are solidified (a reflow process). This process is carried out to reduce formation of an oxide film, and the like, which are formed on a surface of a metal (and to remove the oxide film and the like) so as to obtain reliable electrical connection between the plurality of semiconductor chips 30, and between the IF chip 70 and the wiring 96.

Next, the first substrate 10 is cut out at the periphery of the semiconductor chip 30 by using a dicing blade and the like, thereby obtaining an individual stacked body ST that includes the plurality of stacked semiconductor chips 30, the IF chip 70, and the first substrate 10.

Next, the individual stacked body ST is mounted on the second substrate 20. At this time, as illustrated in FIG. 6, the stacked body ST is mounted on the second substrate 20 in a state in which the IF chip 70 and the electrode pad 50 face a surface of the second substrate 20. That is, the stacked body ST is mounted on the second substrate 20 in a state in which the stacked body ST is flipped as compared to the state illustrated in FIG. 5 (the first substrate 10 is set as an upper surface of the stacked body ST).

The second substrate 20 includes the solder ball 60 on the internal connection terminal 80 on a front surface thereof, and the external connection terminal 90 on a back surface thereof. The electrode pad 50 of the stacked body ST comes into contact with the solder ball 60.

Next, the first substrate 10 and the second substrate 20 are heated while being pressed in directions toward each other, and then cooled or allowed to cool (a reflow process). Thus, the electrode pad 50 of the stacked body ST is electrically connected to the solder ball 60, and is electrically connected to the internal connection terminal 80 or the external connection terminal 90. In addition, the first bump 32 of the semiconductor chip 30 is connected to an electrode 33 of another adjacent semiconductor chip 30. In addition, in the reflow process, the first adhesive 101 and the second adhesive 102 are reflowed, and bond the semiconductor chips 30 adjacent to each other.

Electrical connections between the plurality of semiconductor chips 30 in the stacked body ST, and electrical connections between the stacked body ST and the second substrate 20 may be provided in the same reflow process. Alternatively, electrical connections between the plurality of semiconductor chips 30 in the stacked body ST, and electrical connections between the stacked body ST and the second substrate 20 may be provided in a different reflow process. In this case, a first reflow process may be carried out to electrically connect the plurality of semiconductor chips 30 in the stacked body ST prior to mounting of the stacked body ST onto the second substrate 20. Then the stacked body ST is mounted on the second substrate 20. Thereafter, a second reflow process may be carried out to electrically connect the stacked body ST and the second substrate 20.

Next, a liquid sealing resin 40 is flowed or forced between the first substrate 10 and the second substrate 20 (an underfill process). Thus, a space between the plurality of stacked semiconductor chips 30, and a space between the stacked body ST and the second substrate 20 are filled with the sealing resin 40.

Then, the second substrate 20 and the hardened sealing resin 40 are cut by using a dicing blade or the like to obtain an individual stacked body ST with second substrate 20 and the hardened sealing resin 40. Thus, in this manner, the semiconductor device 1 illustrated in FIG. 1 is completed.

As described above, in this embodiment, the second adhesives 102a_1 having a layout area smaller than that of the first adhesives 101 are provided in the corner region Rc, and are arranged in a location farther from the center or the moment of inertia of the first surface F1 in comparison to the location of the plurality of first adhesives 101. Thus, the a region of the second adhesives 102 with a relatively high elasticity is provided between the semiconductor chips 30 in the corner region Rc, and thus it is possible to suppress the deviation in the gap between the semiconductor chips 30 in the central portion of the semiconductor chips 30 and the corner region Rc.

In addition, the first adhesives 101 providing relatively high rigidity are provided in the vicinity of the center (in the vicinity of the bump region Rb) of the first surface F1 of the semiconductor chips 30. Thus, it is possible to stabilize the gap between the semiconductor chips 30 to a predetermined gap even in the reflow process.

Second Embodiment

Figure 7:
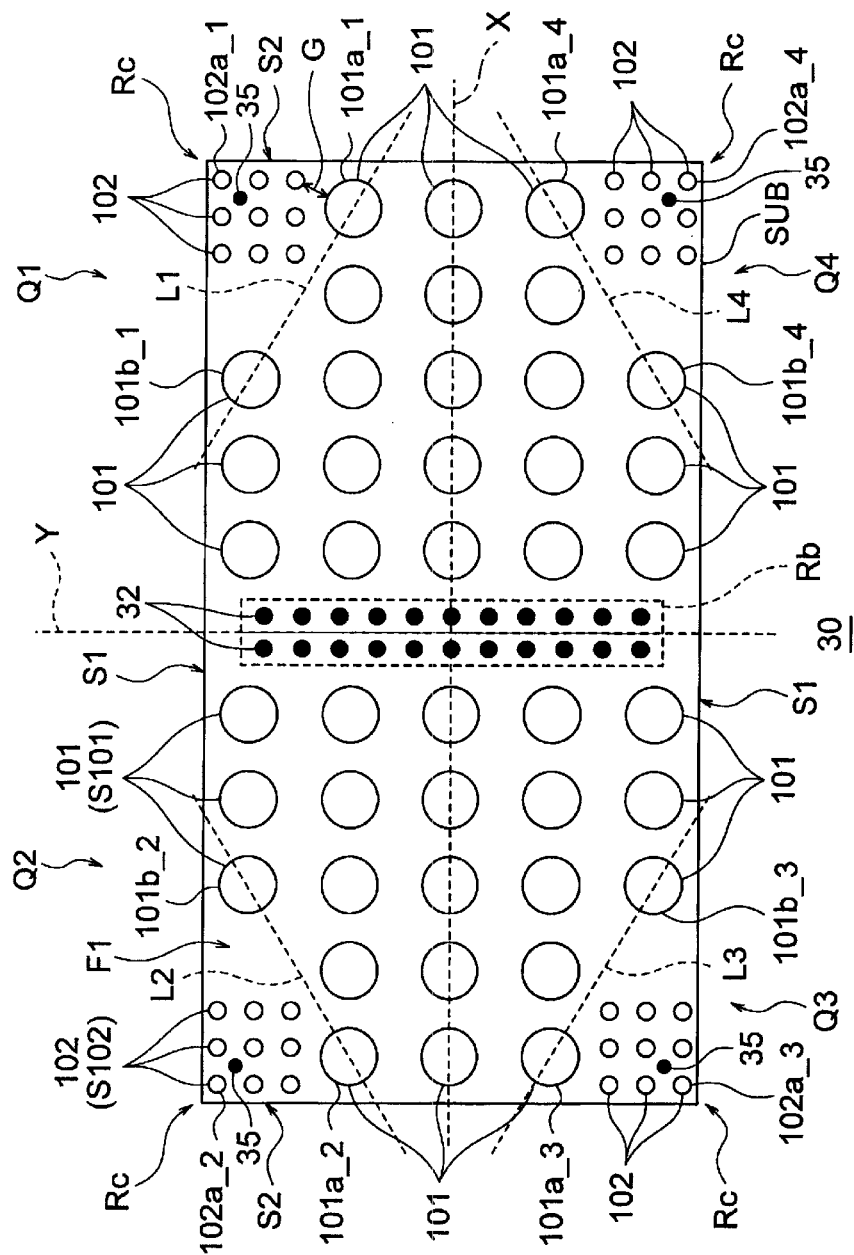
FIG. 7 is a plan view illustrating an example of a configuration of a semiconductor chip according to a second embodiment.

FIG. 7 is a plan view illustrating an example of a configuration of a semiconductor chip 30 according to a second embodiment. The semiconductor chip 30 according to the second embodiment further includes a second bump (micro bump) 35 in the corner region Rc. The remainder of the layout of the second embodiment may be the same as the corresponding layout of the first embodiment.

As is the case with the first bump 32, the second bump 35 is electrically connected to a through-via (not illustrated) that passes between the first surface F1 and the second surface F2 of the semiconductor chip 30. Thus, the plurality of second bumps 35 in the plurality of the stacked semiconductor chips 30 is commonly connected.

The second bump 35 is arranged in each corner region Rc of the first to fourth quadrants Q1 to Q4. The second bump 35 is provided between second adhesives 102 adjacent to each other in the corner region Rc. In addition, the second bump 35 is located at a position that is closer to the geometric center of the first surface F1 in comparison to the second adhesives 102a_1 to 102a_4 which are farthest from the geometric center of the first surface F1. Thus, although the second bump 35 is provided in the corner region Rc, the second adhesive 102 suppresses peeling-off between the semiconductor chips 30 in the corner region Rc. Accordingly, it is possible to maintain electrical connection with another second bump 35 between the stacked semiconductor chips 30.

For example, the second bump 35 is a power supply terminal or a ground terminal that is capable of being electrically connected to a power supply or a ground, and supplies a potential such as a power supply potential or a ground potential to a semiconductor element in each of the semiconductor chips 30.

In a case where the power supply terminal and the ground terminal are provided only in the bump region Rb, although the power supply potential or the ground potential is applied to a semiconductor element (for example, a memory cell) that exists at a position close to the bump region Rb in a relatively short time, it takes a relatively long time for the power supply potential or the ground potential to be applied to a semiconductor element that exists at a position farther away from the bump region Rb.

In contrast, in the second embodiment, the power supply terminal and the ground terminal are provided not only in the bump region Rb but also in the corner region Rc. As is described above, when the second bump 35 as the power supply terminal or the ground terminal are provided in the corner region Rc similar to the second embodiment, it is possible to apply the power supply potential or the ground potential to a semiconductor element, which exists at a position farther from the bump region Rb, in a short time. This leads to a high-speed operation of the semiconductor device 1.

Figure 8A:
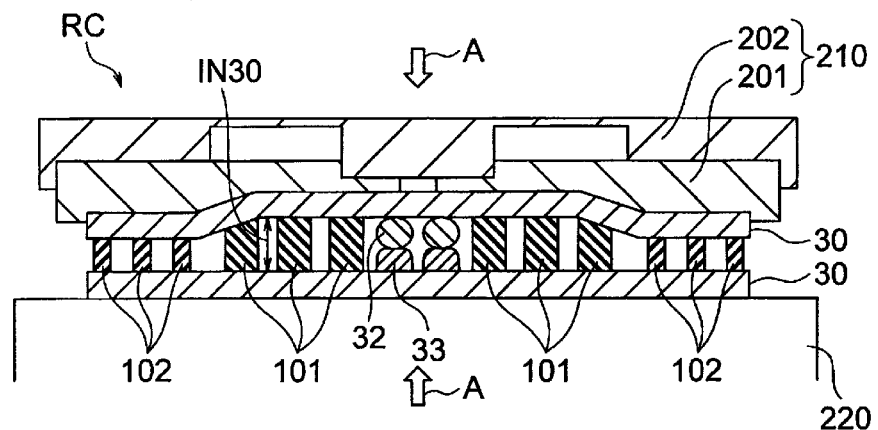
FIGS. 8A and 8B are schematic cross-sectional views illustrating an aspect of the semiconductor chip in a stacking process.
Figure 8B:
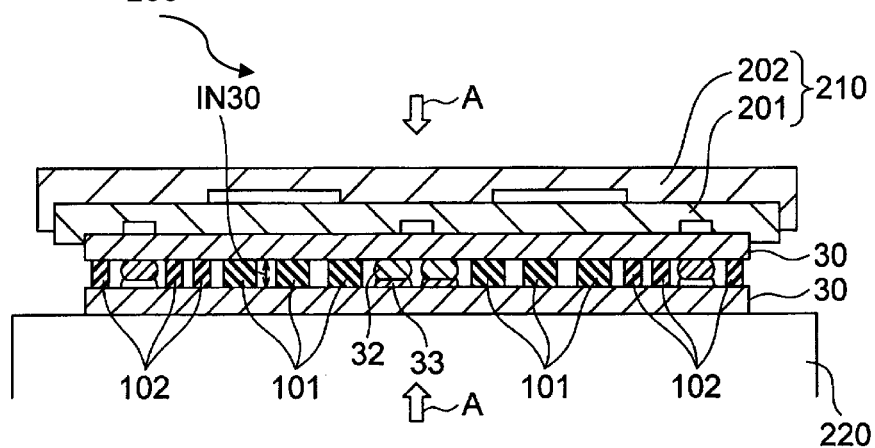

In addition, when the second bump 35 is provided in the corner region Rc, the second bump 35 may support the corner region Rc of the semiconductor chip 30 during the reflow process. For example, FIGS. 8A and 8B are schematic cross-sectional views illustrating an aspect of the semiconductor chip 30 in the stacking process. In FIGS. 8A and 8B, two stacked semiconductor chips 30 which are stacked under pressure in a direction indicated by arrows A by a pressurization apparatus 200. The pressurization apparatus 200 includes a pressurization section 210 and a stage 220. The pressurization section 210 includes an elastic body (for example, an elastomer) 201 and a holder 202 that holds the elastic body 201. The pressurization section 210 presses the plurality of semiconductor chips 30 which are mounted on the stage 220 toward the stage 220. At this time, the semiconductor chips 30 are heated to the melting temperature of the bumps.

The elastic body 201 of the pressurization apparatus 200 elastically presses the semiconductor chips 30, and presses not only the central portion (bump region Rb) but also the corner regions Rc of the semiconductor chips 30. Accordingly, as illustrated in FIG. 8A, in a case where the second bump 35 is not provided, the corner regions Rc is compressed more than the central portion of the semiconductor chips 30 during the stacking process, and thus the gap IN30 between the semiconductor chips 30 in the corner region Rc becomes less than the gap IN30 between the semiconductor chips 30 in the central portion.

On the other hand, in the second embodiment, as illustrated in FIG. 8B, since the second bump 35 is provided in the corner region Rc, the second bump 35 supports the semiconductor chips 30 in the corner region Rc during the reflow process. Thus, the corner region Rc does not compress more with respect to the central portion of the semiconductor chips 30, and the gap IN30 between the semiconductor chips 30 in the corner region Rc and the gap IN30 between the semiconductor chips 30 in the central portion may be made substantially the same. Thus, it is possible to suppress the deviation in the gap between the semiconductor chips 30 in the central portion and the corner regions Rc of the semiconductor chips 30.

In addition, in the second embodiment, the first adhesive 101 and the second adhesive 102 are provided similar to the first embodiment. Accordingly, in the second embodiment, it is possible to further obtain the same effect as in the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

APPENDIX A—ADDITIONAL DISCLOSURE STATEMENTS

Statement A

A semiconductor device, including:

a semiconductor chip in which a first bump is provided on a first surface;

a plurality of first adhesives that are provided on the first surface of the semiconductor chip; and a second adhesive that is provided on the first surface of the semiconductor chip, and of which a layout area on the first surface is smaller than a layout area of the plurality of first adhesives, wherein in comparison to a first adhesive that is farthest from the center or the center of gravity of the first surface of the semiconductor chip among the plurality of the first adhesives, the second adhesive is provided farther from the center or the center of gravity.

Additional Statement B

The semiconductor device according to Statement A, wherein the first surface of the semiconductor chip has a substantially polygonal shape, and the second adhesive is provided at a corner region on the first surface having a substantially polygonal shape.

Additional Statement C

The semiconductor device according to Statement A, further including:

a second bump that is provided in the corner region.

Additional Statement D

The semiconductor device according to Additional Statement C, wherein the first bump is arranged at a position that is closer to the center or the center of gravity of the first surface in comparison to the corner region, and the second bump is arranged at a position, which is closer to the center or the center of gravity of the first surface, in the corner region in comparison to the second adhesive.

Additional Statement E

The semiconductor device according to Additional Statement C, wherein the second bump is a power supply terminal or a ground terminal which is connectable to a power supply or a ground.

Additional Statement F

The semiconductor device according to Additional Statement D, wherein the second bump is a power supply terminal or a ground terminal which is connectable to a power supply or a ground.

Additional Statement G

The semiconductor device according to Statement A, wherein a minimum gap between the first adhesives and the second adhesive on the first surface is determined in accordance with a size of a planar shape of the first adhesives on the first surface.

Additional Statement H

The semiconductor device according to Additional Statement G, wherein the minimum gap is equal to or greater than a diameter of the first adhesives on the first surface.

APPENDIX B—ADDITIONAL DISCLOSURE STATEMENTS

Statement A

A semiconductor device, comprising:

a semiconductor chip having a first bump on a first surface;

a plurality of first adhesive portions provided on a first layout area of the first surface of the semiconductor chip; and a second adhesive portion provided on a second layout area of the first surface of the semiconductor chip, smaller than the first layout area, wherein the second adhesive portion is located farther from a center of the semiconductor chip when compared to a first one of the first adhesive portions of the plurality of first adhesive portions that is furthest from the center of the semiconductor chip.

Additional Statement B

The device according to Statement A, wherein the first surface of the semiconductor chip has a substantially polygonal shape including a short side and a long side, the second adhesive portion is provided in a first region on the first surface which is surrounded by a first straight line, a portion of the short side, and a portion of the long side, and the first straight line is a line that connects the first one of the first adhesive portions of the plurality of first adhesive portions which is positioned on the short side of the first surface furthest from a geometric center of the first surface, and a second adhesive portion of the plurality of first adhesive portions which is positioned on the long side of the first surface furthest from the geometric center of the first surface.

Additional Statement C

The device according to Statement B, wherein a minimum lateral gap between the plurality of first adhesive portions and the second adhesive portion on the first surface is determined by a dimension of the plurality of first adhesive portions.

Additional Statement D

The device according to Additional Statement B, further comprising:

a second bump in the first region.

Additional Statement E

The device according to Additional Statement D, wherein a minimum lateral gap between the plurality of first adhesive portions and the second adhesive portion on the first surface is determined in accordance with a dimension (e.g., width or diameter) of the plurality of first adhesive portions on the first surface.

Additional Statement F

The device according to Additional Statement B, wherein the second adhesive portion comprises three or more separated second adhesive portions.

Additional Statement G

The device according to Additional Statement F, wherein a minimum lateral gap between the plurality of first adhesive portions and the second adhesive portion is determined in accordance with a dimension (e.g., width or diameter) of the plurality of first adhesive portions.

Additional Statement H

The device according to Additional Statement F, further comprising:

a second bump in the first region.

Additional Statement I

The device according to Additional Statement H, wherein a minimum lateral gap between the first adhesive portions and the second adhesive portion on the first surface is determined in accordance with a size of a shape of the first adhesive portions on the first surface.

Additional Statement J

The device according to Additional Statement I, wherein the second bump is a power supply terminal or a ground terminal which is electrically connectable to a power supply or a ground.

Additional Statement K

The device according to Additional Statement I, wherein the first bump is located at a position that is closer than the first region to the geometric center of the first surface, and the second bump is located at a position in the first region which is closer than the second adhesive portion to the geometric center of the first surface.

Additional Statement L

The device according to Additional Statement K, wherein a minimum lateral gap between the first adhesive portions and the second adhesive portion on the first surface is determined in accordance with a size of a shape of the first adhesive portions on the first surface.

Additional Statement M

The device according to Additional Statement K, wherein the second bump is a power supply terminal or a ground terminal which is electrically connectable to a power supply or a ground.

Additional Statement N

The device according to Additional Statement M, wherein a minimum lateral gap between the first adhesive portions and the second adhesive portion on the first surface is determined in accordance with a size of a shape of the first adhesive portions on the first surface.

Additional Statement O

The device according to Additional Statement N, wherein the minimum lateral gap is equal to or greater than a diameter of the plurality of first adhesive portions.

Additional Statement P

The device according to Statement A, wherein a minimum lateral gap between the plurality of first adhesive portions and the second adhesive portion is determined in accordance with a dimension of the plurality of first adhesive portions on the first surface.

Additional Statement Q

A semiconductor device, comprising:

a plurality of stacked semiconductor chips each having a first bump on a first surface opposing a second surface;

a plurality of first adhesive portions in a first layout area between the first surface of one of the semiconductor chips and the second surface of an adjacent semiconductor chip; and a second adhesive portion in a second layout area between the first surface of one of the semiconductor chips and the second surface of an adjacent semiconductor chip, the second layout area being smaller than the first layout area, wherein the second adhesive portion is farther from a center of the semiconductor device than a first adhesive portion of the plurality of first adhesive portions that is furthest from the center of the semiconductor device.

Additional Statement R

The semiconductor device according to Additional Statement Q, wherein a minimum lateral gap between the first adhesive portions and the second adhesive portion on the first surface is determined in accordance with a size of a shape of the first adhesive portions on the first surface.

Additional Statement R

The semiconductor device according to Additional Statement Q, further comprising:

a second bump in the second adhesive portion.

Additional Statement S

A semiconductor device, comprising:

a plurality of stacked semiconductor chips each having a first bump on a first surface opposing a second surface;

a plurality of first adhesive portions in a first layout area between the first surface of one of the semiconductor chips and the second surface of an adjacent semiconductor chip; and a second adhesive portion in a second layout area between the first surface of one of the semiconductor chips and the second surface of an adjacent semiconductor chip, the second layout area being smaller than the first layout area, wherein a gap between a center and corner regions of adjacent semiconductor chips is the same, and wherein a minimum lateral gap between the first adhesive portions and the second adhesive portion on the first surface is determined according to a size of a shape of the first adhesive portions on the first surface.

What is claimed is:

1. A semiconductor device, comprising:
a first semiconductor chip having a first bump in a bump region on a first surface of the first semiconductor chip;
a second semiconductor chip bonded to the first surface of the first semiconductor chip;
a plurality of first adhesive portions spaced laterally from one another and positioned outside of the bump region on a first layout area of the first surface of the first semiconductor chip; and
a second adhesive portion provided on a second layout area of the first surface of the first semiconductor chip, the second layout area occupying an area smaller than an area the first layout area, wherein
the second adhesive portion is located farther from the bump region of the first semiconductor chip as compared to a location of the plurality of first adhesive portions relative to the bump region, and
the first adhesive portions and the second adhesive portion are adhered to the first and second semiconductor chips.

2. The device according to claim 1, wherein
the first surface of the first semiconductor chip has a substantially polygonal shape including a short side and a long side,
the second adhesive portion is provided in a first region on the first surface which is surrounded by a first straight line, a portion of the short side, and a portion of the long side, and
the first straight line is a line that connects a first one of the first adhesive portions in the plurality of first adhesive portions, the first one of the first adhesive portions being positioned on the short side of the first surface farthest from a geometric center of the first surface, and a second one of the first adhesive portions in the plurality of first adhesive portions, the second one of the first adhesive portions being positioned on the long side of the first surface farthest from the geometric center of the first surface.

3. The device according to claim 2, wherein a minimum lateral gap between the plurality of first adhesive portions and the second adhesive portion on the first surface is greater than or equal to a planar dimension of one of the first adhesive portions on the first surface.

4. The device according to claim 2, further comprising: a second bump in the first region.

5. The device according to claim 4, wherein a minimum lateral gap between the plurality of first adhesive portions and the second adhesive portion on the first surface is greater than or equal to a planar dimension of one of the first adhesive portions on the first surface.

6. The device according to claim 2, wherein the second adhesive portion comprises three or more separated portions.

7. The device according to claim 6, wherein a minimum lateral gap between the plurality of first adhesive portions and the second adhesive portion is greater than or equal to a planar dimension of one of the first adhesive portions on the first surface.

8. The device according to claim 6, further comprising: a second bump in the first region.

9. The device according to claim 8, wherein a minimum lateral gap between the first adhesive portions and the second adhesive portion on the first surface is greater than or equal to a planar dimension of one of the first adhesive portions on the first surface.

10. The device according to claim 9, wherein the second bump is a power supply terminal or a ground terminal which is electrically connectable to a power supply or a ground.

11. The device according to claim 9, wherein
the first bump is located at a position that is closer than the first region to the geometric center of the first surface, and
the second bump is located at a position in the first region which is closer than the second adhesive portion to the geometric center of the first surface.

12. The device according to claim 11, wherein a minimum lateral gap between the first adhesive portions and the second adhesive portion on the first surface is greater than or equal to a planar dimension of one of the first adhesive portions on the first surface.

13. The device according to claim 11, wherein the second bump is a power supply terminal or a ground terminal which is electrically connectable to a power supply or a ground.

14. The device according to claim 13, wherein a minimum lateral gap between the first adhesive portions and the second adhesive portion on the first surface is greater than or equal to a planar dimension of one of the first adhesive portions on the first surface.

15. The device according to claim 14, wherein the planar dimension is a diameter.

16. The device according to claim 1, wherein a minimum lateral gap between the plurality of first adhesive portions and the second adhesive portion is greater than or equal to a planar dimension of one of the first adhesive portions on the first surface.

17. A semiconductor device, comprising:
a plurality of stacked semiconductor chips each having a first surface opposing a second surface in a first direction, each first surface having a first bump thereon, the first bump being located near a center of the first surface in a second direction orthogonal to the first direction;
a plurality of first adhesive portions in a first layout area between the first surface of first one of the stacked semiconductor chips and the second surface of a second one of the stacked semiconductor chips adjacent to the first one of the stacked semiconductor chips in the first direction, and the first adhesive portions each have a columnar shape and are separated from one another in the second direction; and
a second adhesive portion in a second layout area between the first surface of the first one of the stacked semiconductor chips and the second surface of the second one of the stacked semiconductor chip, the second layout area being located at a corner region of the first surface and having an area smaller than an area of the first layout area, wherein
the first adhesive portions and the second adhesive portion are each adhered to both the first one and the second one of the stacked semiconductor chips.

18. The semiconductor device according to claim 17, wherein a minimum lateral gap between the first adhesive portions and the second adhesive portion on the first surface is greater than or equal to a planar dimension of a first adhesive portion on the first surface.

19. The semiconductor device according to claim 17, further comprising:
a second bump in the second adhesive portion.

20. A semiconductor device, comprising:
a plurality of stacked semiconductor chips each having a first bump on a first surface opposing a second surface along a first direction;
a plurality of first adhesive portions each having a columnar shape and positioned in a first layout area between the first surface of one of the stacked semiconductor chips and the second surface of an adjacent one of the stacked semiconductor chips in the first direction; and
a second adhesive portion in a second layout area between the first surface of the one of the stacked semiconductor chips and the second surface of the adjacent one of the stacked semiconductor chips in the first direction, the second layout area being smaller than the first layout area in a second direction that is orthogonal to the first direction, wherein
a gap between adjacent semiconductor chips in the plurality of stacked semiconductor chips is the same in a center region of the adjacent semiconductor chips and corner regions of the adjacent semiconductor chips in the first direction, and
a minimum lateral gap between the plurality of first adhesive portions and the second adhesive portion on the first surface in the second direction is greater than or equal to a maximum lateral dimension along the first surface of the first adhesive portions in the second direction, and
the first adhesive portions and the second adhesive portion are each in direct contact with and adhered to the adjacent semiconductor chips.

* * * * *